United States Patent [19]

Limburg et al.

[11] 4,338,222

[45] Jul. 6, 1982

[54] SEMICONDUCTIVE ORGANIC COMPOSITIONS

[75] Inventors: William W. Limburg, Penfield; Damodar M. Pai, Fairport; James M. Pearson, Webster, all of N.Y.

[73] Assignee: Xerox Corporation, Stamford, Conn.

[21] Appl. No.: 139,312

[22] Filed: Apr. 11, 1980

[51] Int. Cl.³ .............................................. A01B 1/00
[52] U.S. Cl. ................................... 252/500; 252/511; 252/518; 252/501.1; 430/79; 430/59
[58] Field of Search ...................... 252/500, 501.1, 511, 252/518, 63.5, 63.7; 357/8, 2; 430/59, 73, 74, 75, 79, 80; 428/411, 518, 514

[56] References Cited

U.S. PATENT DOCUMENTS

| | | | |
|---|---|---|---|
| 4,055,420 | 10/1977 | Limburg et al. | 430/79 |
| 4,156,757 | 5/1979 | Graser et al. | 252/500 |
| 4,202,799 | 5/1980 | Yoshimura et al. | 252/500 |
| 4,302,522 | 11/1981 | Garnett et al. | 430/79 |

OTHER PUBLICATIONS

"Chemical Control of Cond. in a Molecularly-Doped Polymer", J. Mort et al., *Journal of Electronic Materials,* vol. 9, No. 2, 1980, pp. 411–418.

*Primary Examiner*—Joseph L. Schofer
*Assistant Examiner*—J. L. Barr

[57] ABSTRACT

An electrically conducting composition comprising an organic hole transporting compound and the reaction product of an organic hole transporting compound and an oxidizing agent capable of accepting one electron from the hole transporting compound.

15 Claims, No Drawings

SEMICONDUCTIVE ORGANIC COMPOSITIONS

The present invention relates to conductive organic compositions. Hole transport in organic materials can be envisaged as a hopping process of the hole as a series of one electron transfers from the neutral molecule to an adjacent hole site. This process then produces a hole at the molecule which has lost the electron. During the instant the hole is residing at a donor molecular site, there is actually present a cation radical of the donor molecule.

The purpose of the instant invention is to propose and give working examples of a system whereby organic compositions containing donor-type molecules can be permanently doped with cation-radicals in the form of the reaction product of an organic hole transporting molecule and an oxidizing agent capable of oxidizing said transporting molecule by the removal therefrom of one electron with no other chemical change. Examples of other chemical changes which are avoided are disproportionation, cation radical-cation radical dimerization and loss of more than one electron, e.g., the formation of a dye cation. By the technique of the present invention, the organic system will have its conductivity permanently changed.

It is an object of this invention to present comparatively high conductivity organic compositions.

The foregoing object and others are accomplished in accordance with this invention by providing a conducting composition comprising an organic hole transporting compound and the reaction product of an organic hole transporting compound and an oxidizing agent capable of accepting one electron from the hole transporting molecule.

A hole transporting compound is a compound which donates an electron to a hole photoexcited in a contiguous photoconductor. The cation radical so created by donating the electron can accept an electron from another molecule (hole transporting compound) thus rendering charge transport. A hole transporting compound can also donate an electron to an externally introduced cation radical thus rendering charge transport.

Non-hole transporting organic polymers contemplated by the present invention are dielectric materials which act as the matrix of the compositions when a small molecule hole transporting compound is dissolved therein. These include polycarbonate resins having a molecular weight of from about 20,000 to about 120,000. Materials most preferred as the polycarbonate resin are: poly(4,4''-isopropylidene-diphenylene carbonate) and phenolphthalein polycarbonate. Materials within the scope of this description are available as Lexan 145 having a molecular weight of from about 25,000 to about 40,000, Lexan 141 having a molecular weight from about 40,000 to 45,000, both of these materials are available from the General Electric Company; and Makrolon having a molecular weight from about 50,000 to about 120,000 available from Farbenfabricken Bayer AG; Merlon having a molecular weight of about 20,000 to about 50,000 available from Mobay Chemical Company. Other polymers include poly(styrene), poly-(oxy-2,6-dimethyl-1,4-phenylene), polyolefins, polyesters, polyamides, polyacrylates, polymethacrylates, etc.

The hole transporting compounds which may be employed are of two kinds: (1) small molecules, in the sense that they are not polymeric, and (2) polymeric. Effective small molecules include the following: N,N'-diphenyl-N,N'-bis(phenylmethyl)-[1,1'-diphenyl]-4,4'-diamine; N,N'-diphenyl-N,N'-bis-(2-methylphenyl)-[2,2'-dimethyl-1,1'-diphenyl]-4,4'-diamine; N,N,N'N'-tetraphenyl[2,2'-dimethyl-1,1'-diphenyl]-4,4'-diamine; 14-bis[bis-4'-phenylmethylamino-2'-methyl phenyl)methyl]benzene N,N'-diphenyl-N,N'-bis(3-methylphenyl)[p-terphenyl]-4,4''-diamine; 2,5-bis(4'-dimethylaminophenyl)-1-ethyl-1,3,4-triazole; 2,5-bis(4'-dimethylaminophenyl)-1,3,4-oxidiazole; etc. As used herein, the phrase "organic hole transporting molecule or compound" is also intended to include macromolecules, such as poly(N-vinylcarbazole) and poly-1-vinylpyrene, which are hole transporting. In this instance, the material can be termed a hole transporting organic polymer.

As indicated above, the compositions which are rendered semiconducting by the technique of the present invention comprise an organic hole transporting compound and said reaction product. The organic hole transporting compound can be a small molecule or polymeric. When it is polymeric, a non-hole transporting organic polymer may or may not also be present in the composition. When it is a small molecule, there is greater practical utility when a non-hole transporting organic polymer is the matrix for the small molecule. In any of the above cases, the reaction product can be formed in situ during the preparation of the semiconducting compositions depending upon resistivity desired. Alternatively, the reaction product can be separately formed and then added to the hole transporting compound.

In most cases, the composition of the present invention will comprise three components: (1) a polymeric matrix, (2) a hole transporting compound and (3) the reaction product of a hole transporting compound and an oxidizing agent as described infra. The hole transporting compound precursor of the reaction product can be the same or different from the transporting compound of the composition. When the hole transporting compound is a macromolecule having polymer characteristics as in the case of poly(N-vinylcarbazole) then the composition may have only two components, i.e. (1) this polymeric hole transporting and (2) the reaction product.

Examples of oxidizing agents capable of accepting one electron from the hole transporting molecule are salts having the following anions and cations:
anion: $SbCl_6^-$; $SbCl_4^-$; $PF_6^-$; $BF_4^-$; $ClO_4^-$
cation: triphenyl methyl$^+$; tetraethylammonium$^+$; benzyl dimethylphenyl ammonium$^+$; 2,4,6-trimethyl pyrylium$^+$; tropylium$^+$; (p-bromophenyl)ammonium$^+$; $Ag^+$; $K^+$; $Na^+$; $NO^+$.

The salts which consist of the anion and cation of any of the above can be employed in order to oxidize the hole transporting compounds.

Other oxidizing agents operable herein are 2,4,6-trinitrobenzene sulfonic acid; dichloromaleic anhydride; tetrabromophthalic anhydride; 2,7-dinitro-9-fluorenone; 2,4,7-trinitro-9-fluorenone; tetraphenyl phthalic anhydride; $SeO_2$; $N_2O_4$ and any other oxidizing agents function to accept one electron from the hole transporting molecule.

As indicated above, the oxidizing agent can be reacted with a selected hole transporting compound, the resultant product, i.e. the oxidized hole transporting compound, isolated and incorporated into the resin-hole transporting compound solution. On evaporation of the solvent, a conductive organic composition is obtained.

The hole transporting compound that is oxidized need not be the same as the hole transporting compound dissolved in the resin.

When employing a hole transporting organic polymer, the weight ratio of the polymer to the reaction product is such that for every one part by weight of the polymer there is from about 0.000001 to 10 parts by weight of the reaction product. When employing a non-hole transporting organic polymer and an organic hole transporting molecule, the latter is dissolved in the polymer in an amount ranging from about 10 to about 75 percent by weight of the combination. In this instance, the weight ratio range of the hole transporting compound to said reaction product is such that for every one part by weight of the hole transporting compound there is from about 0.000001 to 10 parts by weight of said reaction product. In both instances, this will result in a semiconductive polymer composition having a resistivity range of from about $10^7$ to $10^-$ohm cm.

The conductive organic polymers of the instant invention have utility in packaging electrical components and devices. Certain components and devices can be injured or destroyed by the build-up of static charge on dielectric films used in packaging. The instant films being conductive will not hold a charge. These films also can be employed as the substrate for electrostatographic imaging members.

In the conductive polymer compositions of the present invention, the conduction mechanism is electronic rather than ionic. As a result, there is virtually no conductivity variation because of changes in ambient conditions, e.g., humidity fluctuations. Conductivity of this material is proportional to charge carrier mobility and the mobility is inherently high. Because tfhe preferred substituted tetraaryl diamine species has one of the highest known charge carrier mobilities in organic systems, this permits an increase in the upper limit of the conductivity of useful organic systems.

The following examples further specifically define the present invention. The percentages are by weight unless otherwise specified.

EXAMPLE I

A solution of 40% N,N'-diphenyl-N,N'-bis(3-methylphenyl)-[1,1'-biphenyl]-4,4'-diamine, i.e., 0.2 grm, in 60% Makrolon polycarbonate, i.e. 0.3 gram, is prepared using 3 mls. of methylene chloride as a common solvent. This composition is coated on a ball grained aluminum substrate so as to yield, after drying at 80° C. for 24 hours, a film approximately 25 microns thick. The film is corona charged to a negative potential of 1800 volts and the dark decay monitored as a function of time. Negligible dark decay rate indicates that the film is insulating.

EXAMPLE II

A solution as in Example I is prepared except that it also contains 100 micrograms of the hexachloroantimonate salt of N,N'-diphenyl-N,N'-bis(3-methylphenyl)-[1,1'-biphenyl]-4,4'diamine. This salt is prepared as follows: tris(p-bromophenyl) ammoniumyl hexachloroantimonate (9.56 milligrams, 1.17 $\times 10^{-5}$ mole) and N,N'-diphenyl-N,N'-bis(3-methylphenyl)-[1,1'biphenyl]-4,4'diamine (60.4 g, $1.17 \times 10^{-4}$ mole) are dissolved in one liter of methylene chloride. A 0.2 milliliter aliquot of this solution contains 1.2 micrograms of the subject salt. Thus, the addition of a 10 ml aliquot to the 40% diamine-60% polycarbonate solution will introduce thereto 60 micrograms of the salt. This solution is used to yield a film of approximately 25 microns thick by coating it on a ball grained aluminum substrate and evaporating the solvent at 80° C. for 24 hours.

This film does not accept charge when corona charged negatively. The result indicates that the salt doping of the film has rendered it conductive.

EXAMPLE III

A film of the composition of Example I is coated on an aluminum plate that had previously been coated with a 1000 A thick gold layer. The device is dried at 80° C. for 24 hours. When exposed to a negative charging means capable of charging an insulating film to 1800 volts, the film did not accept any charge. The charging of the film of Example I on aluminum demonstrated that the film was insulating. In the instant example, the zero charge acceptance is the result of the injection of positive carriers from the gold substrate. This demonstrates that gold makes a perfect ohmic or injecting contact to the subject organic film. This will find utility in the electrical component art.

The ohmic nature of the gold contact makes it possible to measure the conductivity of the compositions of the present invention.

EXAMPLE IV

In this example, the composition of Example I is prepared as therein stated and coated on a gold-coated aluminum substrate. A second gold electrode is vapor deposited on top of this film.

For comparison purposes, two more compositions were prepared utilizing the materials of Example II except that in one composition it contained 0.03% of the salt (60 micrograms) based on the weight of the diamine, and in the other composition, it contained 0.3% of the salt (600 micrograms) based on the weight of the diamine. These compositions also were coated on gold coated aluminum substrates and a gold counterelectrode deposited thereon.

The resistivity of these films were measured as follow:

The gold-organic film-gold sandwich structure is connected in a circuit containing a voltage supply and an ammeter. The current through the device is measured as a function of the applied voltage. The data is plotted and the relationship between the current and the voltage is found to be linear. The slope of the line [voltage/current] is the resistance R of the device and it is related to the resistivity $\rho$ by the relationship $R = \rho L/A$, where L is the thickness of the film and A is the area of the gold electrode deposited on the film.

The resistivity of Example I measured $2 \times 10^{14}$ ohm cm.

The resistivity of the film containing 0.03% of salt measured $2 \times 10^{10}$ ohm cm, i.e., four orders of magnitude lower than the undoped film.

The resistivity of the film containing 0.3% of the salt measured $2 \times 10^9$ ohm cm, which is five orders of magnitude lower than the undoped film.

This example shows that an insulating film of a dielectric polymer and a hole transporting molecule of the type disclosed herein can be progressively and controllably made more conductive by including therein an appropriate amount of the reaction product of the oxidizing agent and the hole transporting compound, i.e., the cation radical of the hole transporting compound.

EXAMPLE V

In this example, the resistivity of poly(N-vinylcarbazole), hereinafter PVK, alone is compared with a series of 5 semiconductive compositions containing varying amounts of the reaction product of an oxidizing agent and a hole transporting compound.

The first device contains only PVK.

(1) 10 gms. of poly(N-vinylcarbazole) was dissolved in 90 gms. of tetrahydrofuran. An aliquot of this composition was coated to yield a 25 micron thick layer on an aluminum plate that had previously been coated with a 1000 A thick gold layer. The device is dried at 80° C. for 24 hours. A second gold electrode is vapor deposited on top of this film. The resistivity of this film measured $10^{16}$ ohm cm.

(2) To a 6 ml aliquot of the PVK-tetrahydrofuran solution (0.6 gms., $3.1 \times 10^{-3}$ mole of PVK) was added 0.0000244 gms. ($2.97 \times 10^{-8}$ mole) of tris(p-bromophenyl) ammoniumyl hexachloroantimonate and 0.00001598 gms, $3.09 \times 10^{-8}$ mole of N,N'-diphenyl-N,N'-bis(3-methylphenyl)-[1,1'-biphenyl]-4,4'diamine.

This solution was used to coat a 25 micron thick layer on a gold coated aluminum layer. After drying as above, a gold counterelectrode was deposited, the resistivity of this film measured 10 ohm cm.

In the same manner as above, four more devices were prepared.

(3) To a 6 ml aliquot of the PVK solution was added 0.000244 gms. ($2.97 \times 10^{-7}$ mole) of the antimonate and 0.0001598 gms. ($3.09 \times 10^{-7}$ mole) of the same diamine.

(4) To a 6 mol aliquot of the PVK solution was added 0.00244 gms. ($2.97 \times 10^{-6}$ mole) of the antimonate and 0.001598 gms. ($3.09 \times 10^{-6}$ mole) of the same diamine.

(5) To a 6 ml aliquot of the PVK solution was added 0.0244 gms. ($2.97 \times 10^{-5}$ mole) of the antimonate and 0.01598 gms. ($3.09 \times 10^{-5}$ mole) of the same diamine.

(6) To a 6 ml aliquot of the PVK solution was added 0.244 gms ($2.97 \times 10^{-4}$ mole) of the antimonate and 0.1598 gms. ($3.09 \times 10^{-4}$ mole) of the same diamine.

As in (2) above, these solutions were used to coat a 25 micron thick layer on a gold coated aluminum layer. After drying, a gold counterelectrode was deposited on each device. The resistivity of (3) was $2 \times 10^{11}$ ohm cm.; (4) was $5 \times 10^9$ ohm cm.; (5) was $5 \times 10^8$ ohm cm.; and (6) was $10^8$ ohm cm.

We claim:

1. An electrically conducting composition comprising an organic hole transporting compound selected from the group consisting of of N,N'-diphenyl-N,N'-bis(phenylmethyl)-[1,1'-diphenyl]-4,4'-diamine; N,N'-diphenyl-N,N'-bis-(2-methylphenyl)-[2,2'-dimethyl-1,1'-diphenyl]-4,4'-diamine; N,N,N'N'-tetraphenyl-[2,2'-dimethyl-1,1'-diphenyl]-4,4'-diamine; 1,4-bis[bis-4'-phenylmethylamino-2'-methylphenyl)methyl] benzene N,N'-diphenyl-N,N'-bis(3-methylphenyl)[p-terphenyl]-4,4"-diamine; 2,5-bis(4' dimethylaminophenyl)-1-ethyl-1,3,4-triazole; 2,5-bis(4'dimethylaminophenyl)-1,3,4-oxidiazole; poly(N-vinylcarbazole) and poly-1-vinylpyrene and the cation radical oxidation reaction product of a selected organic hole transporting compound and an oxidizing agent capable of accepting one electron from the hole transporting compounds, said cation radical oxidation reaction product being present in said composition in an amount sufficient to increase the conductivity of the organic hole transporting compound.

2. The composition of claim 1 wherein for every one part by weight of hole transporting compound there is from about 0.000001 to 10 parts by weight of said cation radical oxidation reaction product.

3. The composition of claim 1 wherein the hole transporting compound precursor of the cation radical oxidation reaction product is the same as the hole transporting compound of the composition.

4. The composition of claim 1 wherein the hole transporting compound recursor of the cation radical oxidation reaction product is different from the hole transporting compound of the composition.

5. The composition of claim 4 wherein said cation radical oxidation reaction product is of a selected organic amine capable of loosing one electron to the oxidizing agent and said oxidizing agent is a salt of an anion selected from the group consisting of $SbCl_6^-$; $SbCl_4^-$; $PF_6^-$; and $ClO_4^-$; and a cation selected from the group consisting of a triphenyl methyl$^+$; tetraethylammonium$^+$; benzyl dimethylphenyl ammonium$^+$; 2,4,6-trimethyl pyrylium$^+$; tropylium$^+$)p-bromophenyl) ammonium$^+$; Ag$^+$; K$^+$; Na$^+$ and NO$^+$.

6. The composition of claim 4 wherein said cation radical oxidation product is of a selected organic amine capable of loosing one electron to the oxidizing agent and said oxidizing agent is a member selected from the group consisting of 2,4,6-trinitrobenzene sulfonic acid; dichloromaleic anhydride; tetrabromophthalic anhydride; 2,7-dinitro-9-fluorenone; 2,4,7-trinitro-9-fluorenone; tetraphenyl phthalic anhydride: $SeO_3$; and $N_2O_4$.

7. The composition of claim 5 wherein said organic hole transporting compound is poly(N-vinylcarbazole).

8. The composition of claim 7 wherein the organic hole transporting compound precursor of the cation radical oxidation reaction product is N,N'-diphenyl-N,N'-bis(3-methylphenyl-[1,1'-biphenyl]-4,4'-diamine.

9. The composition of claim 8 wherein the salt is hexachloroantimonate.

10. The composition of claim 2 wherein said organic hole transporting compound and said cation radical oxidation reaction product are dispersed in a polycarbonate matrix, said organic hole transporting compound being present in an amount of from about 10 to about 75 percent by weight of the composition.

11. The composition of claim 10 wherein the organic hole transporting compound precursor of the cation radical oxidation reaction product is the same as the transporting compound of the composition.

12. The composition of claim 11 wherein said cation radical oxidation reaction product is of a selected organic amine capable of loosing one electron to the oxidizing agent and said oxidizing agent is a salt of an anion selected from the group consisting of $SbCl_6^-$; $SbCl_4^-$; $PF_6^-$; and $ClO_4^-$; and a cation selected from the group consisting of triphenyl methyl; tetraethylammonium$^+$; benzyl dimethylphenyl ammonium$^+$; 2,4,6-trimethyl pyrylium$^+$; tropylium$^+$; (p-bromophenyl) ammonium$^+$; Ag$^+$; K$^+$; Na$^+$; and NO$^+$.

13. The composition of claim 11 wherein said cation radical oxidation reaction product is of a selected organic amine capable of loosing one electron to the oxidizing agent and said oxidizing agent is a member selected from the group consisting of 2,4,6-trinitrobenzene sulfonic acid; dichloromaleic anhydride; tetrabromophthalic anhydride; 2,7-dinitro-9-fluorenone, 2,4,7-trinitro-9-fluorenone; tetraphenyl phthalic anhydride; $SeO_2$; and $N_2O_4$.

14. The composition of claim 12 wherein said organic hole transporting compound and said organic amine are N,N'-diphenyl-N,N'-bis(3-methylphenyl)-[1,1'-diphenyl]-4,4'-diamine.

15. The composition of claim 14 wherein said oxidizing agent is hexachloroantimonate.

* * * * *